United States Patent [19]

Malloy et al.

[11] Patent Number: 5,731,222
[45] Date of Patent: Mar. 24, 1998

[54] EXTERNALLY CONNECTED THIN ELECTRONIC CIRCUIT HAVING RECESSED BONDING PADS

[75] Inventors: Gerard T. Malloy, Oceanside; Joe B. Tyra, Ventura, both of Calif.

[73] Assignee: Hughes Aircraft Company, Los Angeles, Calif.

[21] Appl. No.: 509,849

[22] Filed: Aug. 1, 1995

[51] Int. Cl.$^6$ .......................... H01L 21/283; H01L 21/60
[52] U.S. Cl. .......................... 437/182; 437/183; 437/203; 437/205; 437/207; 437/211; 437/219; 437/226; 437/947; 437/981; 257/784
[58] Field of Search .......................... 437/183, 203, 437/182, 205, 207, 211, 219, 226, 947, 981; 257/784

[56] References Cited

U.S. PATENT DOCUMENTS

| | | | |
|---|---|---|---|
| 4,622,574 | 11/1986 | Garcia | 357/55 |
| 5,146,308 | 9/1992 | Chance et al. | 357/55 |
| 5,341,027 | 8/1994 | Park et al. | 257/786 |
| 5,414,351 | 5/1995 | Hsu et al. | 324/756 |
| 5,432,127 | 7/1995 | Lamson et al. | 437/182 |

Primary Examiner—David Graybill
Attorney, Agent, or Firm—W. C. Schubert; W. K. Denson-Low

[57] ABSTRACT

Recesses (46) are etched into the finished peripheral boundaries of a structure formed of a generally planar electronic circuit (40) on an upper surface (42) of a wafer (44). Bonding pads (48) are deposited in the recesses (46) and interconnected to the electronic circuit (40). External leads (52) are attached to the bonding pads (48), such that the external leads (52) lie below the plane of the electronic circuit (40).

7 Claims, 2 Drawing Sheets

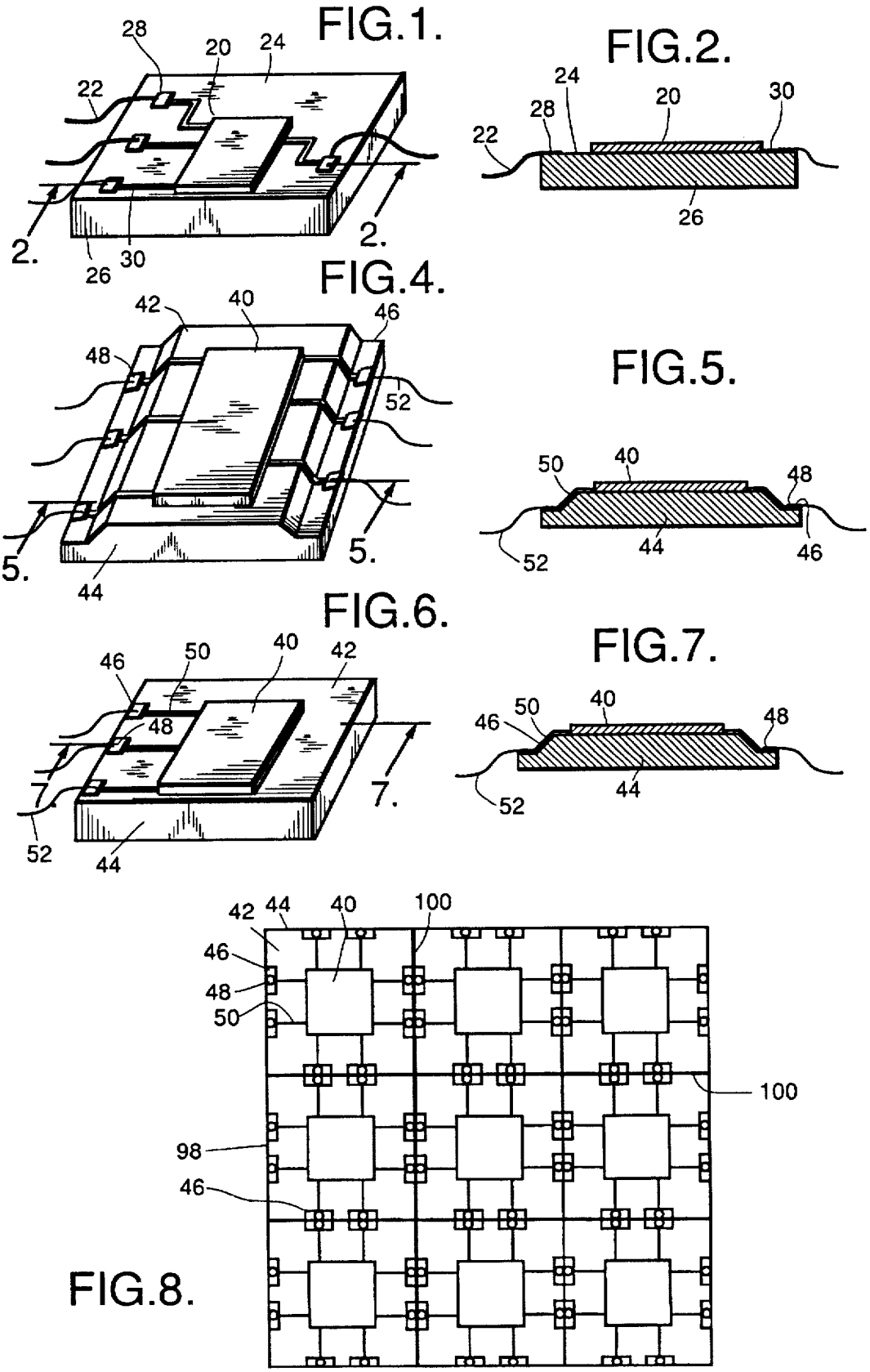

EXTERNALLY CONNECTED THIN ELECTRONIC CIRCUIT HAVING RECESSED BONDING PADS

BACKGROUND OF THE INVENTION

This invention relates to microelectronic devices, and, more particularly, to an approach for accomplishing external connections to such devices.

Many types of electronic circuits (including devices such as sensors, as used herein) are fabricated by microelectronic techniques. In this approach, an electronic circuit is formed on an upper surface of a semiconductor wafer. The preparation of the electronic circuit usually involves multiple steps of deposition, patterning, etching, and the like. The resulting electronic circuit is described as "generally planar" because it is formed on the upper surface of the wafer and because its thickness is usually much less than its lateral extent. Large arrays of circuit elements in single circuits or multiple circuits can be fabricated on a single wafer by this technique.

The generally planar electronic circuit must be externally connected to bring input signals and power from external sources, and to send output signals to external users. In one common approach, bonding pads are formed at the edges of the electronic circuit on the surface of the wafer. Traces are deposited on the upper surface of the wafer from the bonding pads to the electronic circuit. External connections are made to the bonding pads using operable techniques such as wire bonding.

This approach is widely used, but in some cases has the drawback that the wire-bonded leads extend above the plane of the generally planar electronic circuit. In this position, the leads can interfere with the use of the circuits in certain applications. For example, if the electronic circuit is part of a flow sensor that measures a fluid flow past the sensor, the upwardly extending leads can alter the flow pattern and produce erroneous flow measurements.

Three approaches are available to overcome this problem. The wafer can be made oversize so that the bonding pads are positioned well away from the electronic circuit, or "beam lead" connections can be used. Both of these approaches require a highly oversize wafer. In a third approach, the external connections can be made through via connections formed through the wafer to its back side. This approach requires the use of thinner wafers in many cases than would be otherwise desirable, and can also be expensive to accomplish. Existing techniques are therefore not fully satisfactory.

There exists a need for an improved approach for externally connecting generally planar electronic circuits in a manner such that the connections do not extend substantially above the plane of the electronic circuit. The present invention fulfills this need, and further provides related advantages.

SUMMARY OF THE INVENTION

The present invention provides a method for fabricating an externally connected electronic circuit, and a circuit made by this approach. The process produces a circuit structure in which the external lead connection does not extend above the plane of the generally planar electronic circuit. The necessary interconnection structure can be prepared as an extension of the microelectronic fabrication technique used to form the circuit itself. The process is relatively inexpensive to practice, and does not require an enlarged wafer size for the electronic circuit.

In accordance with the invention, a method for fabricating an externally connected electronic circuit comprises the steps of providing a generally planar electronic circuit on an upper surface of a wafer having a finished peripheral boundary and forming at least one recess at the finished peripheral boundary of the wafer. The method further includes forming at least one bonding pad in the at least one recess, connecting the at least one bonding pad to the planar electronic circuit, and attaching an external lead to the at least one bonding pad.

In the preferred approach, the electronic circuit is fabricated on the wafer using conventional microelectronic fabrication techniques. At least one recess, and preferably a plurality of recesses, are formed at the finished peripheral boundary of the wafer by any operable technique. It is preferred to form the recesses by depositing an etch-resistant layer overlying the upper surface of the wafer, patterning the etch-resistant layer to define at least one region where the recess is to be located, and etching material from the wafer in the at least one patterned region. The etching is desirably performed with an anisotropic chemical etchant.

The bonding pads and the interconnection of the bonding pads to the electronic circuit can be accomplished in a single metallization operation. A dielectric film is formed over the upper surface of the wafer and patterned. An electrical conductor is deposited to form the bonding pads and the traces extending from the bonding pads to the electronic circuit.

The external leads are attached to the bonding pads by any operable technique. The preferred approach is wire bonding a fine lead to the bonding pad. Wire bonding is well established for use with conventional bonding pads and can be applied here as well.

In many cases, a plurality of electronic circuits are formed on a single large wafer. At the conclusion of the fabrication procedure, but prior to wire bonding, the large wafer is diced into individual small wafers with a single electronic circuit on each. In this case, the location of the finished peripheral boundary of each electronic circuit does not lie on the periphery of the large wafer during fabrication. It is therefore necessary that the recesses be formed along the dicing lines, so that they will be along the finished peripheral boundaries at the completion of the procedure. Thus, the present approach is fully compatible with such multicircuit fabrication technology.

After the external leads are bonded to the bonding pads, the do not extend above the plane of the electronic circuit if the recesses have been made sufficiently deep. There is no protrusion of the external leads that would interfere with measurements or the like. The approach does not require access to the back side (bottom) of the wafer.

Other features and advantages of the present invention will be apparent from the following more detailed description of the preferred embodiment, taken in conjunction with the accompanying drawings, which illustrate, by way of example, the principles of the invention.

BRIEF DESCRIPTION OF THE DRAWINGS

FIG. 1 is a perspective view of an electronic circuit using conventional wire-bonded external leads;

FIG. 2 is a sectional view of the electronic circuit of FIG. 1, taken along line 2—2;

FIG. 4 is a perspective view of one form of electronic circuit prepared by the present approach;

FIG. 5 is a sectional view of the electronic circuit of FIG. 4, taken along line 5—5;

FIG. 6 is a perspective view of a second form of electronic circuit prepared by the present approach;

FIG. 7 is a sectional view of the electronic circuit of FIG. 6, taken along line 7—7; and FIG. 8 is a plan view of a wafer structure wherein multiple electronic circuits are fabricated on a single wafer prior to dicing.

DETAILED DESCRIPTION OF THE INVENTION

Figure 3:
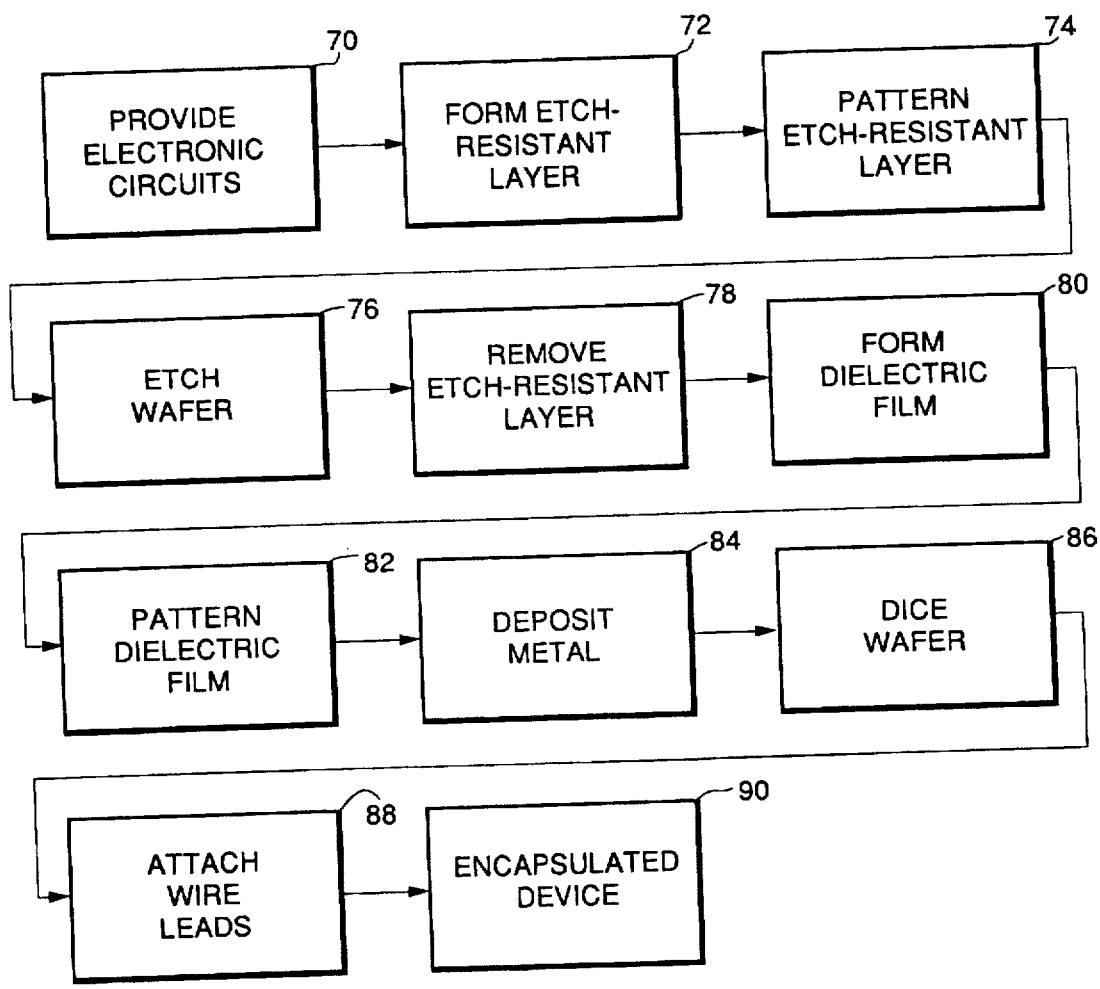
FIG. 3 is a flow chart of the method of the invention.

FIGS. 1 and 2 show a conventional approach for fabricating an electronic circuit 20 with external leads 22. The circuit 20 is formed on an upper surface 24 of a wafer substrate 26. A preferred wafer substrate material is silicon, which is widely used as the substrate for microelectronic devices. Bonding pads 28 and traces 30 extending to the electronic circuit 20 are deposited upon the upper surface 24. The fine wire external leads 22 are connected to the bonding pads 28. As seen in both FIGS. 1 and 2, the external leads 22 extend above the plane of the upper surface 24 of the electronic circuit 20.

FIG. 3 depicts the method according to the invention. FIGS. 4 and 5 illustrate one form of the externally connected electronic circuit of the invention, and FIGS. 6 and 7 illustrate another form.

In the present approach, an electronic circuit 40 is fabricated on an upper surface 42 of a wafer 44, which serves as a substrate, and provided for use, numeral 70. The type of electronic circuit and the details of its fabrication are not a part of the present invention. The present approach may be used with a wide variety of electronic circuits, which term is broadly interpreted to include all generally planar electronic devices. Microelectronic-based sensors are included within the scope of the term, for example.

At least one recess 46, and preferably a plurality of recesses, are formed at a finished peripheral boundary 48 of the wafer 44. The recess 46 is a region that is below the plane of the upper surface 42 of the wafer 44. The term "finished peripheral boundary" is described and defined as follows. The peripheral boundary is that portion of the wafer that is at its periphery or edge. The finished peripheral boundary is the edge of the wafer at the completion of the fabrication procedure. In the structures of FIGS. 4–7, a single electronic circuit is fabricated on the wafer, so that the finished peripheral boundary is the same as the peripheral boundary during the fabrication procedure. FIG. 8 illustrates a situation wherein multiple electronic circuits 40 are fabricated on a single large wafer 98. At a point in the fabrication, the single large wafer 98 is diced along dicing lines 100 to produce multiple individual wafers 44, each of which has one of the electronic circuits 40 thereon. Because the bonding pad regions must be adjacent to the periphery of the wafer 44, the recesses 46 are formed either along the external boundaries of the wafer 98 or along the dicing lines 100. After the dicing occurs, the recesses 46 lie along the finished peripheral boundaries of the individual wafers 44.

Any operable technique may be used to form the recesses 46. In a preferred approach, an etch-resistant layer is deposited overlying the upper surface 42 of the wafer 44 and the electronic circuit, numeral 72. The etch-resistant layer is $SiO_2$ or $Si_3N_4$, about 0.1 micrometer thick. The etch-resistant layer may be deposited or grown on the surface. The etch-resistant layer is patterned using conventional photolithographic procedures, removing that portion of the layer which overlies the intended locations of the recesses 46, numeral 74. Each recess 46 may be large enough for multiple bonding pads, as shown in FIG. 4, or for only a single bonding pad, as shown in FIG. 6.

The recesses 46 are formed by etching the wafer 44 through the openings in the patterned etch-resistant layer, numeral 76. Any operable etching technique, either dry or wet, can be used. A preferred etching approach is a wet etch using an anisotropic etchant. For the case of a [100] silicon wafer, the preferred etch is 12 percent aqueous potassium hydroxide solution used at 60° C. This solution forms a trenched recess 46 with a flat bottom lying on the [100] plane and a sloped side lying on the [111] plane. The recess bottom and side are smooth and conducive to subsequent deposition of a metallization. After etching is complete, the etch-resistant layer is removed using conventional techniques, numeral 78.

Bonding pads 48 are formed at the bottoms of the recesses 46, and connecting traces 50 are formed between the bonding pads 48 and the appropriate location on the electronic circuit 40. In a preferred approach, both the bonding pads 48 and the connecting traces 50 are formed simultaneously. A dielectric film is formed overlying the upper surface 42 of the wafer 44 and the electronic circuit 40, numeral 80. The dielectric film is typically $SiO_2$ for the case of a silicon wafer and is about 0.5 micrometers thick. The dielectric film is patterned using conventional photolithographic procedures to define with openings the locations of the bonding pads 48 and the connecting traces 50, numeral 82.

A conductive material such as a metal, most preferably aluminum-1 percent silicon alloy, is deposited through the openings in the patterned dielectric film, numeral 84. The metal has a thickness as needed, but is typically about 1 micrometer thick. A portion of the metal layer, lying at the bottoms of the recesses 46, becomes the bonding pads 48. Another portion of the metal layer, extending up the inclined sides of the recesses 46 and over the upper surface 42 to the electronic circuit 48, becomes the connecting traces 50, according to the patterning of the step 82.

In the case where a single electronic circuit 40 is formed on the wafer 44, as in FIGS. 4–7, no cutting of the wafer is required. In the case where multiple electronic circuits 40 are formed, the single large wafer 98 is diced along the dice lines 100 to form a multiplicity of individual wafers 44 and circuits 40, numeral 86. Dicing is accomplished by conventional techniques, such as diamond sawing or scribing and breaking.

Fine external leads 52 are attached to the bonding pads 48, numeral 88, by any operable technique. In the preferred approach, the leads 52 are attached by wire bonding, a well established technique wherein the lead 52 and bonding pad 48 are bonded using applied heat and pressure.

In an optional step that follows attachment of the leads 52, the entire structure may be encapsulated, numeral 90, in an epoxy or similar material to protect it against environmental damage and/or mechanical damage. Encapsulation is not shown in the figures.

FIGS. 5 and 7 illustrate the structure in section, following attachment of the leads 52. The leads do not extend above the plane of the electronic circuit. By contrast, in the prior approach of FIG. 2 the leads 22 do extend above the plane of the electronic circuit. The present approach therefore provides a structure wherein a generally planar electronic device has no projecting features above the plane of the electronic circuitry.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method for fabricating an externally connected electronic circuit, comprising the steps of:

provviding a generally planar electronic circuit on an upper surface of a wafer having a finished peripheral boundary;

forming at least one recess at the finished peripheral boundary of the wafer, the step of forming at least one recess including the steps of depositing an etch-resistant layer overlying the upper surface of the wafer, patterning the etch-resistant layer to define at least one region where the recess is to be located, and etching material from the wafer in the at least one patterned region;

removing the etch-resistant layer;

forming a dielectric film over the upper surface of the wafer and patterning the dielectric film;

forming a plurality of bonding pads in the at least one recess and connecting the bonding pads to the planar electronic circuit, the step of forming and connecting being accomplished simultaneously and including the step of depositing an electrical conductor at the locations whereat at least one bonding pad and an electrical interconnection between the bonding pad and the electronic circuit are required; and wire bonding external leads to the bonding pads.

2. The method of claim 1, wherein the step of etching material includes the step of anisotropically etching the wafer.

3. The method of claim 2, wherein the step of anisotropically etching the wafer includes the step of chemically etching the wafer with an anisotropic etch.

4. The method of claim 1, further including an additional step, after the step of wire bonding, of encapsulating the structure resulting after the step of wire bonding.

5. The method of claim 1, wherein the step of providing a generally planar electronic circuit on an upper surface of a wafer having a finished peripheral boundary includes the step of providing a silicon wafer in a [100] orientation.

6. The method of claim 1, wherein the step of providing a generally planar electronic circuit on an upper surface of a wafer having a finished peripheral boundary includes the step of fabricating a plurality of electronic circuits on an oversize wafer, so that the finished peripheral boundary does not coincide with a peripheral boundary of the oversize wafer, and including the additional step, after the step of forming a plurality of bonding pads, of dicing the oversize wafer to form a plurality of diced wafers such that the finished peripheral boundary of each of the plurality of electronic circuits lies at the boundary of each diced wafer.

7. An externally connected electronic circuit prepared by the method of claim 1.

* * * * *